(12) United States Patent
Jarvis et al.

(10) Patent No.: US 6,344,630 B1
(45) Date of Patent: Feb. 5, 2002

(54) THERMOELECTRIC HEATED FOOD SERVICE CART

(75) Inventors: Charles W. Jarvis, Irvine; Johannes Le, Huntington Beach, both of CA (US)

(73) Assignee: Cambro Manufacturing Company, Huntington Beach, CA (US)

(*) Notice: Subject to any disclaimer, the term of this patent is extended or adjusted under 35 U.S.C. 154(b) by 0 days.

(21) Appl. No.: 09/695,891

(22) Filed: Oct. 25, 2000

(51) Int. Cl.[7] .......................... A47J 36/24; F25B 21/02; F25B 17/06
(52) U.S. Cl. .................. 219/386; 219/400; 99/483; 62/3.3
(58) Field of Search ................ 219/214, 386, 219/400; 62/3.2, 3.3, 3.62; 99/483

(56) References Cited

U.S. PATENT DOCUMENTS

| | | | | |
|---|---|---|---|---|
| 3,733,836 A | * | 5/1973 | Corini | 62/3.61 |
| 3,886,346 A | * | 5/1975 | Meyers | 62/3.61 |
| 4,233,495 A | * | 11/1980 | Scoville et al. | 219/386 |
| 4,295,034 A | * | 10/1981 | Assmann | 219/400 |
| 4,301,658 A | * | 11/1981 | Reed | 62/3.3 |
| 4,326,383 A | * | 4/1982 | Reed et al. | 62/3.62 |
| 4,328,676 A | * | 5/1982 | Reed | 62/3.62 |
| 4,543,471 A | * | 9/1985 | Anderson | 219/387 |
| 5,097,759 A | * | 3/1992 | Vilgrain et al. | 99/483 |
| 5,159,177 A | * | 10/1992 | Kinberger | 219/386 |
| 5,196,781 A | * | 3/1993 | Jamieson et al. | 320/61 |
| 5,243,171 A | * | 9/1993 | Wood et al. | 219/386 |
| 5,272,963 A | * | 12/1993 | Fabbro | 99/468 |
| 5,454,471 A | * | 10/1995 | Norvell | 126/400 |
| 5,483,799 A | * | 1/1996 | Dalto | 62/3.7 |
| 5,520,102 A | * | 5/1996 | Monetti | 99/483 |
| 5,765,471 A | * | 6/1998 | Monard | 219/386 |
| 5,782,174 A | * | 7/1998 | Cohn et al. | 99/483 |
| 6,003,319 A | * | 12/1999 | Gilley et al. | 62/3.7 |

* cited by examiner

Primary Examiner—Joseph Pelham
(74) Attorney, Agent, or Firm—George F. Bethel

(57) ABSTRACT

A thermoelectric food service container having a doubled walled plastic molded container with foam disposed between the walls, and a door for access to container. A thermoelectric unit is connected to the container through access openings, and has P and N type semi-conductors connected for the flow of current between them from a power supply. Controls control the flow of current to the P and N type semi-conductors and a fan circulates air within the container over food containers in spaced relationship on support racks within the container.

16 Claims, 4 Drawing Sheets

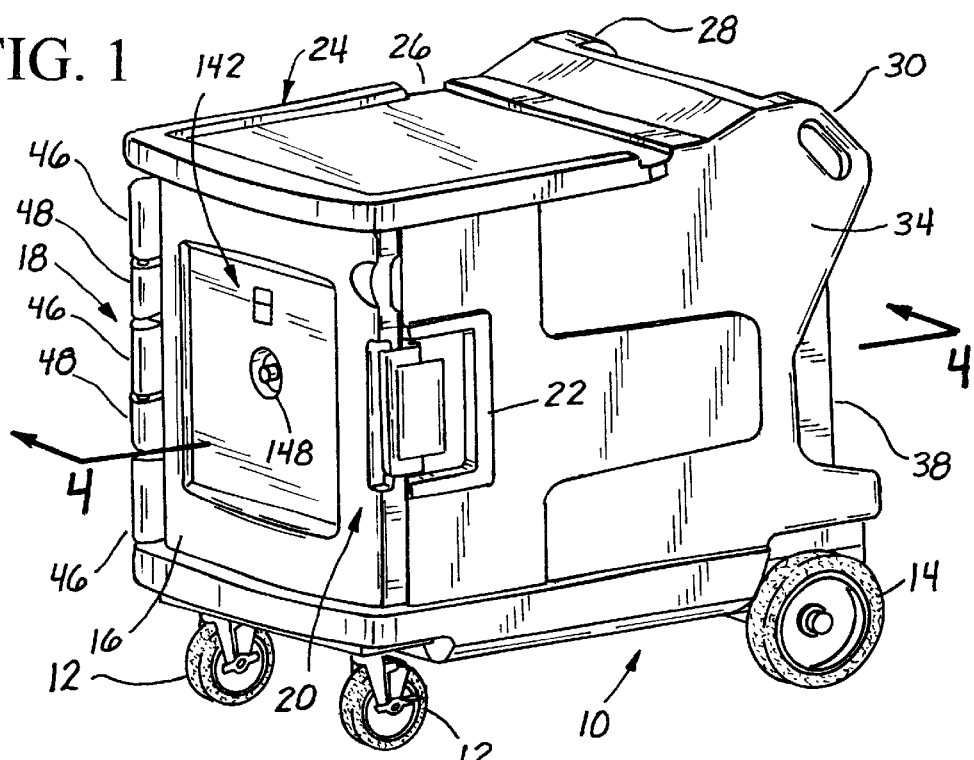

THERMOELECTRIC HEATED FOOD SERVICE CART

BACKGROUND OF THE INVENTION AND PRIOR ART

1. FIELD OF THE INVENTION

The field of this invention is within the field of holding, maintaining, and serving food from a heated cart or container. More specifically, it involves the field of maintaining food in a warm condition by an electrical system.

2. PRIOR ART

The prior art of heating food and maintaining it in a heated condition relies upon multiple trays, holders, and food pans for holding food. The trays, holders, and food pans are often times placed in an insulated container. The insulated container can have wheels and is utilized for maintaining the food in a heated or warm condition for service in institutional facilities.

Such service in institutional facilities can be for hospitals, schools, prisons, restaurants, hotels, and other institutional facilities. Generally, in order to maintain the warmth of the food, the food is emplaced within an insulated container and maintained for an extended period of time by the insulation and nature of the container maintaining the warmth of the food therein.

There have been attempts to maintain food in a heated condition by various heating elements. Such heating elements have been utilized for heating food in various configurations. However, to date, it is not believed that any utilize a thermoelectric solid stating heating element which provides flexibility and utilization all in a compact and serviceable basis.

An object of this invention is to provide for an insulated food cart which protects and insulates food from external environments and holds the moisture for quality food products without the need of a humidifier.

Another object is to hold food temperatures without a heat source in a non-heated passive condition.

A further object of this invention is to provide for a durable plastic dual walled insulated container having knuckle hinges which easily allow opening and removal of the door.

A further object of this invention is to provide a heating unit which has the ability to heat food while at the same time allowing quick recovery when the door is opened and closed. Heating is provided at a low noise level without substantial disruption.

Another object of this invention is to provide for thermoelectric heating without the requirement of heating coils for heating on a preset basis. A solar powered thermometer with a digital display is also provided for ready temperature reading of the internal portion of the cart even though power is not applied, or the unit is not plugged into a power source.

A further object of this invention is to provide for a cart having easily removable chrome plated steel rails or racks to hold pans and trays.

A further object of this invention is to provide for a cart with steering handles for easy steering.

Yet a further object of this invention is to provide for a knuckle hinge assembly on the door so that it can be easily removed for cleaning and other purposes after removal.

Accordingly, this invention has a major object to maintain food in a heated condition within a service cart. The heated condition is provided by a fan or blower which circulates the heated air through a heat exchange system of a thermoelectric heater. The thermoelectric heater comprises a solid state thermoelectric unit with solid state heating elements that are warmed through semi-conductor principals for creating a heated output therefrom.

As a consequence of the solid state and insulated cart combination for heating food, this invention is a substantial improvement over prior food service carts having other types of heating systems or insulated heat maintenance food containers.

SUMMARY OF THE INVENTION

In summation, this invention comprises an insulated food service container which can be moved on casters, and utilizes a thermoelectric heater with an air circulatory system over the heating members of the thermoelectric solid state.

More particularly, it incorporates a cart having a series of racks or holders interiorly thereof. The cart or container is made of a blow molded or rotationally molded configuration having double walls. The walls are filled with insulating foam for maintaining the heat within the container. In order to provide access to the container, a knuckle hinged door with a latching handle is provided overlying an opening to the container.

Opposite from the door, is a thermoelectric heater. The thermoelectric heater comprises thermoelectric heating elements. The thermoelectric heater is connected to vents which open into the interior of the container. When the air in the container is heated by the thermoelectric heater, it then circulates through the container as heated by the thermoelectric elements of the heater. The thermoelectric elements of the heater comprise a solid state series of elements that generate an established degree of heat depending upon how much current is placed across the thermoelectric elements. The solid state nature of the thermoelectric elements enhance the overall desirability as to cleanliness, operational features, practicality, and safety over that of the prior art.

BRIEF DESCRIPTION OF THE DRAWINGS

FIG. 1 shows a perspective view of the thermoelectric cart of this invention.

FIG. 2 shows an exploded view of the thermoelectric cart looking from the underside and back, with the thermoelectric unit exploded therefrom.

DESCRIPTION OF THE PREFERRED EMBODIMENTS

Figure 3:
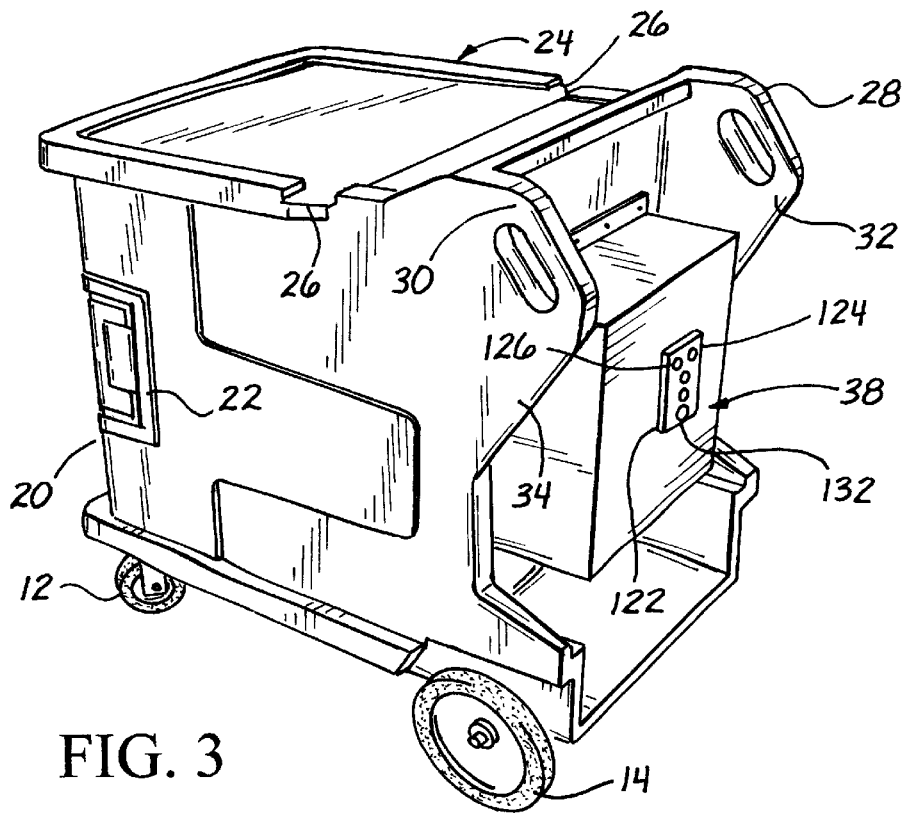
FIG. 3 shows a rear perspective view with the thermoelectric unit in place.

Looking at the Figures it can be seen in FIG. 1 that a perspective view is shown of the portable food warmer, container, or food service cart 10 of this invention. The portable food warmer 10 of this invention is mounted on swivel casters 12 and wheels 14. The swivel casters 12 can be locked and held in the manner known by a locking brake that is pivoted or pressed with a person's foot.

The portable food warmer 10 is formed with a door 16 on hinges 18. The hinges 18 are knuckle hinges so that the door 16 can be lifted when in the open position, removing it from the pinions or hinge pins and the respective knuckles for easy cleaning. In order to secure the door, an over center latch 20 is utilized with a latch handle 22.

On the top of the cart is a rail, flange, or lip 24 going around the exterior periphery in order to hold items and prevent them from sliding or falling off of the top. The rail has a space 26 at either side which allows cleaning and the flow of fluids therefrom.

Steering handles 28 and 30 are provided respectively on either side with grip openings for steering the cart in a facile manner. The handles 28 and 30 are set into projections or in the form of walled appendages in the way of supports respectively 32 and 34. These walled projections allow easy steering of the cart while at the same time providing a recess for receipt of a thermoelectric unit 38 which provides the thermoelectric heating of this invention.

Figure 4:
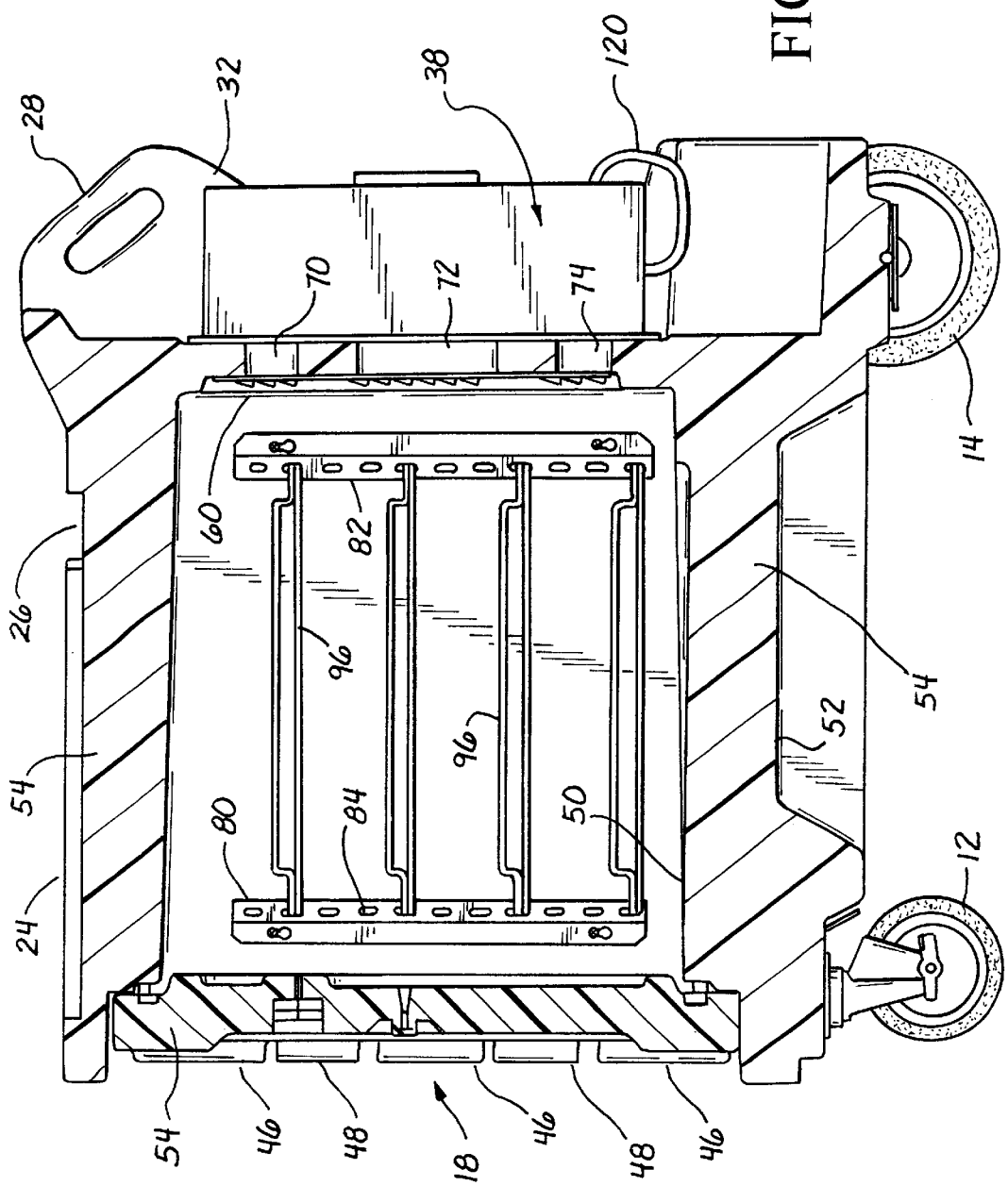
FIG. 4 shows a sectional view in the direction of lines 4—4 of FIG. 1.

Looking more specifically at FIG. 4, it can be seen that the knuckle hinge 18 is shown with door portions 46 which are hinged on body portions 48. The door portions of the hinge can be lifted when turned outwardly. They have a series of pins that are not shown that allow the door portions 46 to be lifted upwardly and removed with their pins from the openings of the body portion.

Looking more specifically at the body portion of the portable food warming cart 10, it can be seen that dual or double walls are provided in the form of spaced plastic walls such as walls 50 and 52. These walls 50 and 52 that comprise the interior and exterior portion of the carrier or cart have been rotationally molded, blow molded, or formed by any other kind of method for forming the plastic molded spaced double walls.

Interiorly of the spaced double walls is a foam core 54 which has been foamed in place to provide for insulation and stiffening. The high insulation character of the foam allows for retention of warmth and heat within the carrier walls.

Figure 5:
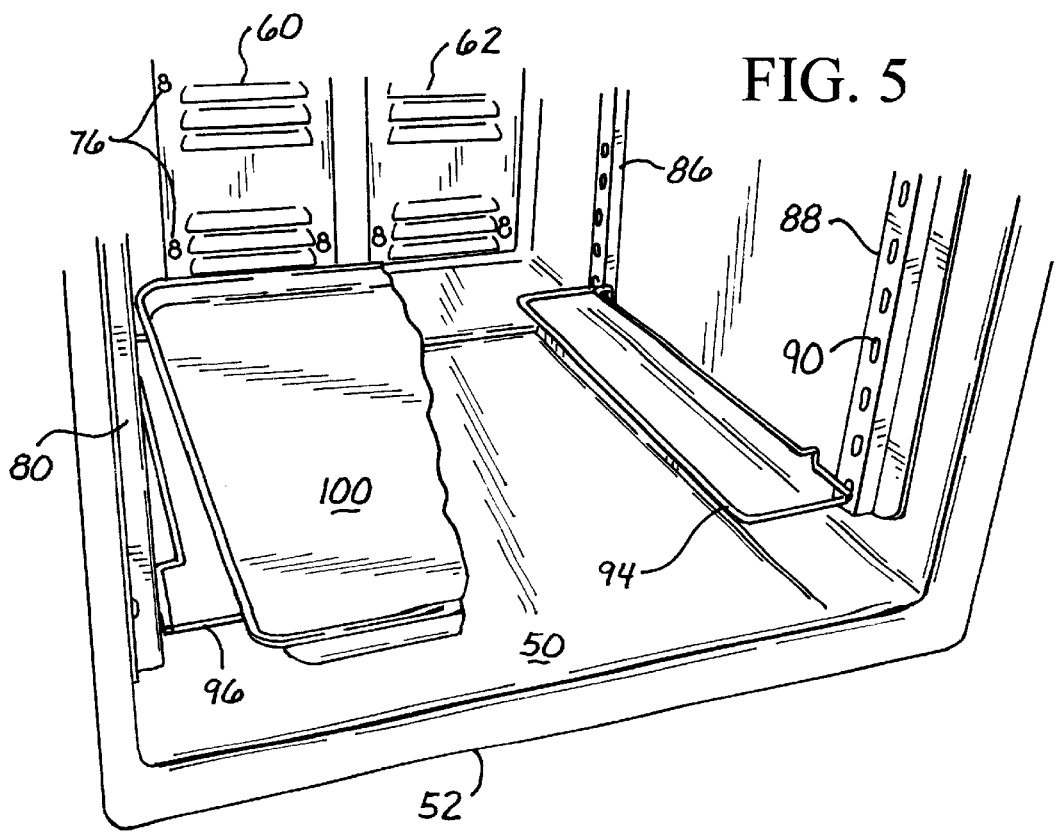
FIG. 5 shows a fragmented internal perspective view of the cart of this invention with a fragmented tray placed upon a rack.

Looking more specifically at the interior shown in FIGS. 4 and 5, it can be seen that a set of louvers 60 and 62 are shown. The louvers 60 and 62 provide a flow of ambient air over the thermoelectric heating elements in the manner to be described hereinafter. These louvers are in communication with openings, ports, or vents 70, 72, and 74 at the back of the cart to allow for the free flow of air therethrough. These openings 70, 72, and 74 are symmetrical on either side and can be seen in FIG. 2 from the rear thereof. The louvers 60 and 62 fit thereover and are screwed, bolted or held in place by any other suitable fastener such as the fasteners shown in FIG. 5, namely fasteners 76.

Looking more particularly at the interior in FIGS. 4 and 5, it can be seen that a pair of rack supports 80 and 82 on one side have a number of openings 84 therein for receipt and support of racks.

On the opposite side, racks 86 and 88 are shown having similar openings, namely openings 90 for receipt and support of racks therein.

The rack supports can be anodized metal, plastic, stainless steel, chrome, or any other type of support and are secured into the side walls, namely interior wall 50. However, any other suitable attachment can be utilized or placed therein.

A number of racks, ledges, or cross members 94 and 96 can be seen inserted into openings 84 and 90. These racks 94 and 96 can support pans and trays, such as the tray 100 shown in a fragmented form in FIG. 5. Any type of pan, tray or food container can be inserted and maintained in a warmed and well heated condition over an extended period of time by this invention. To this extent the racks 80, 82, 86 and 88 maintain the food on trays, pans or other containers in spaced relationship for circulation of warm air to maintain an even and warm condition. The racks can be substituted by ledges, flanges, or shelves extending from the interior of the side walls upon which food containers such as pans and trays 100 can be supported.

Looking more specifically at the thermoelectric unit 38, it can be seen that it is powered by a cord 120. The cord 120 can receive standard wall voltages and amperages in order to allow the unit to operate. In order to control the unit, a panel 122 is shown.

The panel 122 has a main fuse 124. An on/off power switch 126 is provided which can be a rotational type switch or any other type in order to allow for on/off switching of the thermoelectric unit 38.

A power indicator light 128 is shown to indicate the power is on. This can be a green light. A second light 130 is provided in order to indicate when a temperature has been set and has been established. This is a red light and goes on to show the proper temperature has been met.

In order to set the temperature, a temperature setting dial or knob 132 with indicator markings is provided for setting a temperature to which the interior of the cart is to be maintained. Fundamentally, the temperature setting knob 132 provides a thermostatic control of the interior of the cart within the ranges desired.

When the cart is not powered, a passive heating maintenance is provided. In order to indicate the temperature, a solar powered thermometer 142 is provided at the front of the cart on the door 16. This solar powered thermometer 142 can show the temperature of the interior even when the unit is not powered. This is particularly helpful when the unit is in a passive state and the interior temperature is to be ascertained for properly heated food maintenance.

Another feature of this invention is the self ventilating cap 148 on the front door. The self ventilating cap 148 allows for ventilation of the interior while at the same time maintaining internal pressure. Thus, over pressure or under pressure is allowed to be maintained by the self ventilating cap 148.

Figure 6:
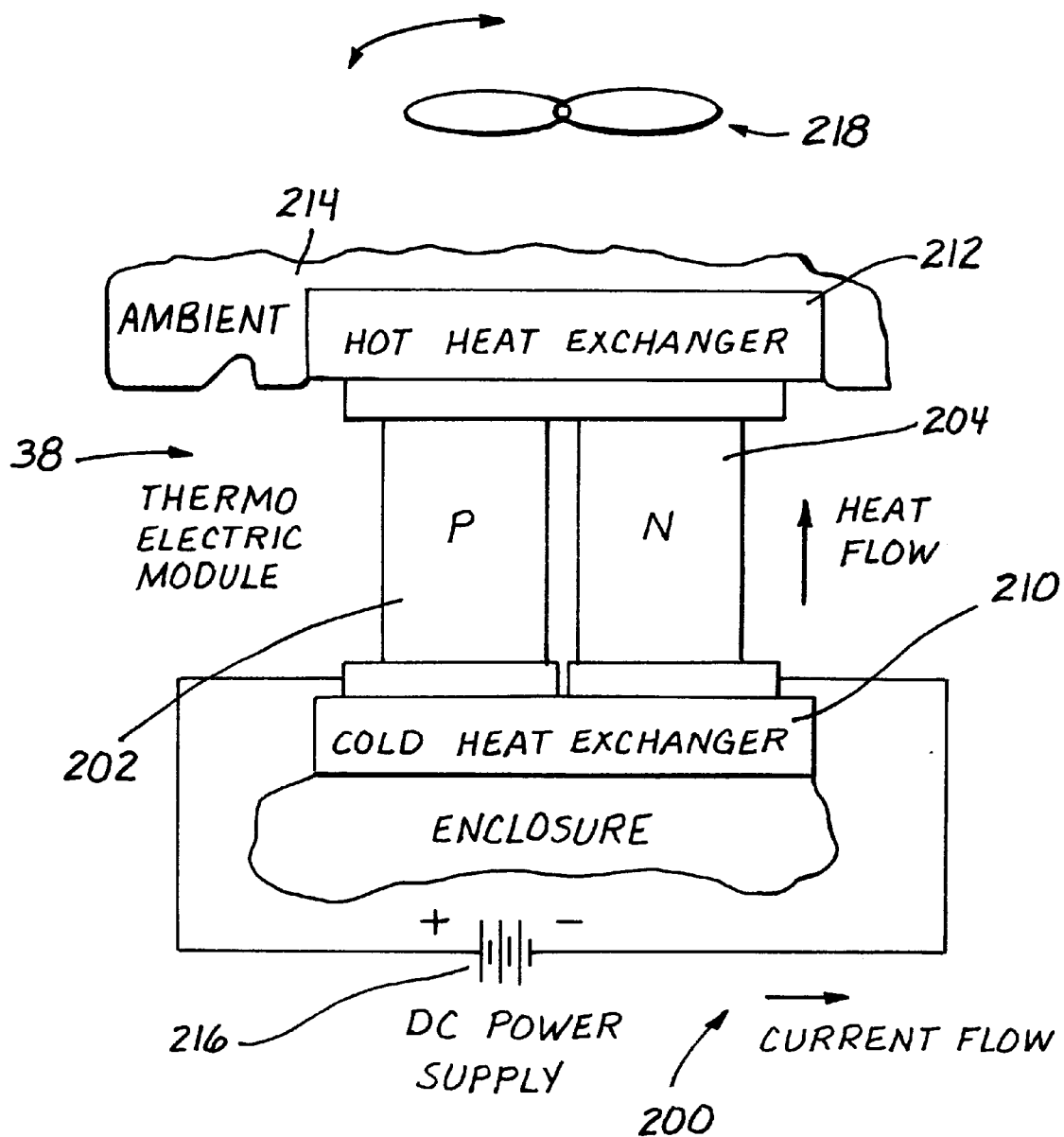
FIG. 6 shows a schematic view of a thermoelectric beater of this invention that is the working portion of the thermoelectric heater.

Looking more specifically at FIG. 6, a schematic diagram for the thermoelectric heating unit is shown. The thermoelectric heating unit is supplied with a source of power from the power cord 120. A DC power supply then converts the AC power to a DC current. As can be seen, this DC current is caused to flow in the direction of arrow 200. This direction of flow is such wherein it causes heating by virtue of the N to P relationship. As the current flows around in the direction of arrow 200, the thermoelectric module provides heat. If the current were to flow in the other direction, the thermoelectric module would provide cooling. In this particular case, it has been established that heating is to take place. As a consequence, current is established in the direction of arrow 200.

The thermoelectric heating unit relies upon a pair or pairs of solid state semi-conductors that are sometimes referred to as dice or die (singular). These semi-conductors are of two types of semi-conductor materials. One is a P-type material, namely P-type material 202. The other is an N-type material 204. These two types of material when forming a junction allow for cooling or heating depending upon the flow of current. Effectively, the P and N semi-conductors, modules, or pairs of them are connected electrically in series and thermally in parallel. There can be a bank of substantial numbers of P and N modules having junctions to provide for the heating.

Electrical current passing through the contact between the P and N semi-conductors absorbs heat energy on the cold junction and dissipates it on the hot junction. These thermoelectric modules operate as a heat pump providing heat flow from the heat exchanger 212.

The semi-conductor materials of the N-type are named because they have more electrons than necessary to complete a perfect molecular lattice structure. In the P-type there are not enough electrons present to complete a lattice structure. The extra electrons in the N-type material and the holes left in the P-type material are called carriers. They are the agents that move the heat energy from the cold to the hot junction. Heat absorbed at the cold junction is pumped to the hot junction at a rate proportional to carrier current passing through the circuit, and the number of couples of P and N junctions.

A well established thermoelectric semi-conductor material such as Bismuth Telluride greatly impedes conventional heat conduction from hot to cold areas yet provides an easy flow for the carriers. In addition, these materials have carriers with a capacity for carrying significant heat.

Thus, the enclosure of the thermoelectric heater, or heating unit 38 is seen with a cold heat exchanger 210. The cold heat exchanger 210 allows for flow to the hot heat exchanger 212 for provision of warm air into the ambient or interior of the food carrier, namely interior 214.

If the DC power supply 216 is changed to allow flow in the other direction, the unit becomes a cooling device for cooling the interior.

In order to create circulation, a fan can be provided in the unit such as fan 218. The fan 218 circulates the air into and around the ambient conditions of the food and food containers or trays 100. This is through the openings, vents, or passages 70 through 74 and the louvers 60 and 62. The fan 218 can be in front or behind the louvers 60 and 62 for the provision of circulatory movement of the interior ambient air.

In greater detail, a typical thermoelectric module or heating unit 38 comprises two ceramic substrates that serve as foundation and electrical insulation for P-type 202 and N-type 204 Bismuth Telluride dice (or die) that are connected electrically in series and thermally in parallel between the ceramics. The ceramics also serve as insulation between the modules' internal electrical elements and a heat sink that must be in contact with the hot side as well as an object against the cold side surface. An electrically conductive material, usually copper pads attached to the ceramics, maintain electrical connections inside the module. Solder is most commonly used at the connection joints to enhance the electrical connections and hold the module together.

While both P-type 202 and N-type 204 materials are alloys of Bismuth and Tellurium, both have different free electron densities at the same temperature. P-type 202 dice (or die) are composed of material having a deficiency of electrons while N-type 204 have an excess of electrons.

As current flows through the module it attempts to establish a new equilibrium within the materials. The current treats the P-type 202 material as a hot junction needing to be cooled and the N-type 204 as a cold junction needing to be heated. Since the material is actually at the same temperature, the result is that the hot side becomes hotter while the cold side becomes colder.

The direction of the current will determine if a particular P or N material will cool down or heat up (i.e. direction of arrow 200 causes heating). In short, reversing the polarity will switch the hot and cold sides.

In operation, the door 16 is closed with the food to be heated therein and the temperature is set by the rotation of the temperature adjustment knob or potentiometer 132. The main power switch 128 is then activated and a green LED power on indicator is then lit. When the required temperature that is set on the temperature setting dial 132 is achieved, a red LED temperature indicator light 130 is turned on. Once the temperature has been set, the unit will maintain this temperature over an extended period of time.

When the unit is disconnected, it will still retain heat during the passive state without the requirement of the module 38 and the air being blown by the fan 218. This is due to the high insulation content of the foam insulation 54 in the walls and the seal provided by the door 16. Thus, the module can be used in an active state or passive state to hold food at a desired temperature. This can be done by preheating and then allowing the food to be maintained in a passive condition for an extended period of time or by actively maintaining the heat at a specified temperature. The unit can be pre-heated, disconnected and rolled to a particular area while at the same time maintaining heat for institutional food service away from the power source connected to the cord 120.

As a consequence, this invention is a broad step over the prior art with regard to multiple types of active and passive food heating through the use of thermoelectric power as controlled by the controls of the invention.

What is claimed is:

1. A thermoelectric food service container comprising:
    a substantially double walled plastic molded container having foam disposed between said walls;
    a door for access to said container;
    a thermoelectric unit connected to said container having communication therewith through access openings;
    said thermoelectric unit having P and N type semiconductors connected for the flow of current therebetween;
    a power supply connected to said P and N type semiconductors to supply DC thereto and for connection to an AC source;
    a connector for connecting said power supply to a source of AC;
    controls for controlling the flow of current to said P and N type of semi-conductor materials; and,
    ledges on the interior walls of said container for holding food containers in spaced relationship within said container.

2. The food service container as claimed in claim 1 further comprising:
    a fan for circulating air within said container.

3. The food service container as claimed in claim 1 wherein said controls comprise:
    a temperature setting switch;
    an indicator to indicate when a set temperature has been reached; and,
    a temperature indicator.

4. A thermoelectric food service cart comprising:
    a substantially plastic molded container having double walls with foam therebetween;
    a thermoelectric unit having P and N semi-conductor materials connected in series;
    a DC power supply connected to said P and N semiconductor materials having an AC to DC current convertor for connection to a source of AC power;

controls for controlling the temperature to be maintained by said thermoelectric unit; and, a solar powered thermometer for indicating the interior temperature of said container.

5. The cart as claimed in claim 4 further comprising:

said controls having a temperature setting switch; and, an indicator to show when a set temperature has been achieved.

6. The cart as claimed in claim 4 further comprising:

food container supports on the interior of said container.

7. The cart as claimed in claim 4 further comprising:

a door connected to said container on knucle hinges which can be removed by opening and lifting said door.

8. A thermoelectric food delivery cart comprising:

a container molded from double walled plastic having insulation between said walls, a thermoelectric unit connected to said container through openings within the walls;

said thermoelectric unit having P and N semiconductors connected in series for heating or cooling said container;

a DC power supply having an AC to DC convertor for connection to an AC power source; and, a thermometer connected to said container which indicates the interior temperature of said container regardless of said AC power.

9. The cart as claimed in claim 8 further comprising:

controls for said heater including a temperature setting switch, an on/off switch, and at least one indicator light to show the status of said thermoelectric heater.

10. The cart as claimed in claim 8 wherein:

said thermometer is a solar powered thermometer to indicate interior container temperature.

11. The cart as claimed in claim 8 further comprising:

food container supports on the interior walls of said cart.

12. The cart as claimed in claim 11 further comprising:

said food container supports are attached to the interior walls of said container for supporting food containers in spaced relationship.

13. A method for delivering heated food to an end user comprising:

providing a double walled molded plastic container having insulation between said walls;

placing food in said container;

heating said food by a thermoelectric heater having P and N semi-conductor materials in series;

flowing a DC current through said P and N semi-conductor materials;

monitoring the temperature within said container by a thermometer having a source of power when said DC current is not flowing; and, removing and serving said food after a desired temperature of said food has been achieved.

14. The method as claimed in claim 13 further comprising:

providing said DC current from an AC to DC convertor connected to a source of AC current.

15. The method as claimed in claim 4 further comprising:

controlling the temperature of food in said container by a switch; and, circulating internal air around said food by a fan.

16. The method as claimed in claim 15 further comprising:

supporting the food on wall supports in said container for circulating air around said food.

* * * * *